(12) United States Patent
Kwon (10) Patent No.: US 8,335,435 B2
(45) Date of Patent: Dec. 18, 2012

(54) NETWORK SYSTEM

(75) Inventor: Gyeong Ju Kwon, Gwangju (KR)

(73) Assignee: LINUXIT, Co., Ltd., Gwangju (KR)

( * ) Notice: Subject to any disclaimer, the term of this patent is extended or adjusted under 35 U.S.C. 154(b) by 436 days.

(21) Appl. No.: 12/665,135

(22) PCT Filed: Jul. 22, 2008

(86) PCT No.: PCT/KR2008/004260
§ 371 (c)(1),
(2), (4) Date: Dec. 17, 2009

(87) PCT Pub. No.: WO2009/017317
PCT Pub. Date: Feb. 5, 2009

(65) Prior Publication Data
US 2010/0196012 A1 Aug. 5, 2010

(30) Foreign Application Priority Data
Jul. 31, 2007 (KR) .......................... 10-2007-0076918

(51) Int. Cl.
*H04B 10/10* (2006.01)
(52) U.S. Cl. ........................................ 398/106; 398/126
(58) Field of Classification Search .................. 398/107, 398/126–127, 172, 106
See application file for complete search history.

(56) References Cited

U.S. PATENT DOCUMENTS 5,099,346 A * 3/1992 Lee et al. ...................... 398/118
2002/0111135 A1* 8/2002 White et al. .................. 455/11.1

* cited by examiner

*Primary Examiner* — Leslie Pascal
(74) *Attorney, Agent, or Firm* — Stein McEwen, LLP

(57) ABSTRACT

Provided is a network system for controlling devices which operate in response to an infrared signal. The network system includes modules and a home server. The modules output the infrared signal for controlling the devices in response to command data or analyze path information of the command data, forward the command data to next one of the modules, and receive infrared control signals generated by the devices. The home server includes ID numbers of the modules and the path information of the command data for allowing the command data to reach each of the modules and outputs the command data or receives the infrared control signals. Therefore, the network conveniently control the devices using the infrared control signal even when the modules are too distant from the home server for the infrared signal to reach the devices at a time or obstacles are placed in front of the modules. Also, the network system performs authentication processes among the modules using time information to prevent the modules from malfunctioning by another infrared signal or command data.

11 Claims, 6 Drawing Sheets

NETWORK SYSTEM

This is a National Phase Application filed under 35 U.S.C. 371 as a national stage of PCT/KR2008/004260, filed on Jul. 22, 2008, an application claiming the benefit of Korean Patent Application 10-2007-0076918, filed on Jul. 31, 2007, the entire content of each of which is hereby incorporated by reference in its entirety.

TECHNICAL FIELD

The present invention relates to a network system, and more particularly, to a network system for controlling devices which operate in response to an infrared signal.

BACKGROUND ART

In general, television (TV) sets, beam projectors, air conditioners, air cleaners, etc. used in homes are controlled by infrared remote controllers. Since such devices used in a home individually have their own remote controllers, several remote controllers are required to control the devices. However, such remote controllers have many disadvantages. For example, the remote controllers are frequently lost, and their batteries are required to be frequently replaced with new ones.

Therefore, home network systems have been developed as ubiquitous environments. However, products, which have been developed before the home network systems are commonly used, are not controlled by the home network systems.

Also, although devices, which have been developed before home network systems are commonly used, are controlled using an infrared signal controlling apparatus, a problem may occur due to the linearity of an infrared signal or an obstacle may be positioned in the middle of the infrared signal. If the devices are too distant from the infrared signal controlling apparatus for the infrared signal to reach the devices, the devices may not be conveniently controlled by the infrared signal.

DETAILED DESCRIPTION OF THE INVENTION

Technical Problem

The present invention provides a network system for conveniently controlling devices which operate in response to an infrared signal in spite of their long distance positions or obstacles in front of them.

Technical Solution

According to an aspect of the present invention, there is provided a network system for controlling devices which operate in response to an infrared signal, including: modules which output an infrared signals for controlling the devices in response to command data or analyze path information of the command data, forward the command data to next one of the modules, and receive infrared control signals generated by the devices; and a home server which includes identification (ID) numbers of the modules and the path information of the command data for allowing the command data to reach each of the modules and outputs the command data or receives the infrared control signals.

Each of the modules may include: a radio frequency (RF) transceiver which receives or forwards the command data; an infrared (IR) transceiver which outputs the infrared signal to the devices or receives the infrared control signals from the devices; a memory unit which stores a scope database (SDB) and a path database (PDB), wherein the SDB indicates ID numbers of modules positioned within a range in which the command data is to be forwarded, and the PDB indicates ID numbers of modules through which the command data passes to be forwarded from the home server to a final one of the modules; a real time clock (RTC) which stores current time and outputs time information; and a controller which controls the RF transceiver and the IR transceiver in response to the SDB and the PDB and performs authentications using the time information of the RTC.

Each of the modules may output scope setting command data to set the SDB, wherein the scope setting command data has a structure of "a passing module number, a control code, and a corresponding module ID number," wherein the passing module number is broadcasting B indicating that the command data is forwarded to all of neighboring modules that the scope setting command data is to reach, and the control code is a scope setting code GMUN indicating that the SDB is collected.

Each of the modules and the home server may forward scope response command data to one of the modules, which has forwarded the scope setting command data, in response to the scope setting command data, wherein the scope response command data has a structure of "a target module number, a control code, and a corresponding module ID number," wherein the target module number is an ID number of one of the modules which has generated the scope setting command data, and the control code is a scope response code MYMUN which is to store the corresponding module ID number in the module which has generated the scope setting command data.

The module may be reset and then output the scope setting command data for collecting the SDB.

Each of the modules may output path setting command data to set the PDB with reference to the SDB, wherein the path setting command data has a structure of "a passing module number, a control code, a target module ID number, and path information," wherein if the SDB comprises an ID number of the home server, the passing module number is the ID number of the home server, the target module ID number is an ID number of a module that the path setting command data is to reach, i.e., the ID number of the home server, the path information is an ID number of a module which outputs the path setting command data, and the control code is a path setting code SAVE PATH which is to store an ID number corresponding to the path information in the home server.

If the SDB includes the ID number of the home server, each of the modules may generate the path setting command data and store its own ID number and the ID number of the home server as the PDB.

One of the modules or the home server may output the path setting command data in response to predetermined path finding command data, wherein the path setting command data has a structure of "a passing module number, a control code, a target module ID number, and path information," wherein the passing module number is an ID number of one of the modules which outputs the path finding command data, the target module ID number is an ID number of one of the modules that the path setting command data is to reach and is determined by path information of the path finding command data, the path information is the same as the path information of the path finding command data, and the control code is a path setting code SAVE PATH which is to store an ID number corresponding to the path information in one of the modules corresponding to the target module ID number.

The path finding command data may be command data which is output from the module to set the PDB with reference to the SDB and has a structure of "a passing module number, a control code, a corresponding module ID number, and path information," wherein the passing module number is broadcasting B indicating that the command data is forwarded to all of neighboring modules that the path finding command data is to reach if the SDB does not comprise the ID number of the home server, but the passing module number is the ID number of the home server if the SDB comprises the ID number of the home server, the control code is a code FIND PATH:FP which is to find a path reaching from one of the modules outputting the path finding command data to the home server, and the path information includes an ID number of one of the modules which outputs the path finding command data and an ID number comprising path information of received path finding command data if an intermediate one of the modules receives the path finding command data and then outputs new path finding command data.

RTCs of the modules may synchronize with one another so that the modules comprise synchronized time information.

The controller may include an encoding module and a decoding module, wherein the encoding module forwards encoded data, which includes time information as a key value, to a corresponding module, wherein the time information is obtained at encoding time, and a decoding module of a controller of the corresponding module decodes the encoded data in response to the time information to authenticate the module, wherein the encoded data includes an ID number of one of the modules which receives the encoded data.

If the devices controlled by the modules output signals including information regarding their operation states, the infrared control signals may be the signals comprising the information regarding the operation states Advantageous Effects A network system according to the present invention conveniently controls devices using an infrared signal even when the devices are too distant from a home server for the infrared signal to reach the devices at a time or obstacles are placed in front of the devices. Also, the network system performs authentications among modules using time information to prevent the modules from malfunctioning due to another infrared signal or command data.

BEST MODE FOR CARRYING OUT THE INVENTION

The attached drawings for illustrating preferred embodiments of the present invention are referred to in order to gain a sufficient understanding of the present invention, the merits thereof, and the objectives accomplished by the implementation of the present invention.

Hereinafter, the present invention will be described in detail by explaining preferred embodiments of the invention with reference to the attached drawings. Like reference numerals in the drawings denote like elements.

Figure 1:
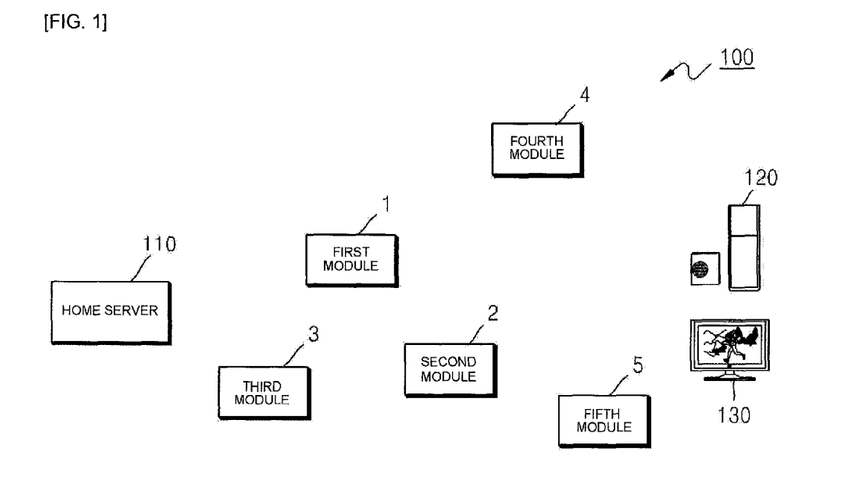
FIG. 1 is a block diagram of a network system according to an embodiment of the present invention.

FIG. 1 is a block diagram of a network system according to an embodiment of the present invention. Referring to FIG. 1, a network system 100 according to the present embodiment includes a home server 110 and a plurality of modules 1, 2, 3, 4, and 5. Devices 120 and 130 are home devices, such as an air conditioner, a digital television (TV) set, a beam projector, an air cleaner, etc., which are controlled by an infrared signal. The modules 1, 2, 3, 4, and 5 receive the infrared signal, which is generated by the home server 110, and forward the infrared signal to the devices 120 and 130 to control the devices 120 and 130.

Although not shown in FIG. 1, the modules 1, 2, 3, 4, and 5 are installed in front of infrared receiving terminals which are installed at outer surfaces of the devices 120 and 130. In other words, the modules 1, 2, 3, 4, and 5 are not separately installed but are installed in front of infrared receiving terminals of devices which operate in response to an infrared signal. Here, the modules 1, 2, 3, 4, and 5 may be installed using a magnet or a kind of adhesive such as a double-faced tape.

In the network system 100 according to the present embodiment, one of the modules 1, 2, 3, 4, and 5 receives a command to generate the infrared signal from the home server 110 and requests a neighboring one of the modules 1, 2, 3, 4, and 5 to generate the infrared signal. Next, the neighboring module requests another neighboring module to generate the infrared signal. As a result, a request for generating the infrared signal is forwarded to a target one of the modules 1, 2, 3, 4, and 5. The final one of the modules 1, 2, 3, 4, and 5 outputs the infrared signal to an infrared receiver of a device, in which the final module is installed, so as to control the device.

In other words, even if an obstacle is placed between the home server 100 and a device or the device is too distant from the home server 110 for an infrared signal to reach the device, the home server 110 may pass through several modules in order to command a final one of the modules to generate an infrared signal.

The modules 1, 2, 3, 4, and 5 respond to command data to output the infrared signal for controlling the devices 120 and 130. Alternatively, the modules 1, 2, 3, 4, and 5 may analyze path information of the command data to forward the command data to next one of the modules 1, 2, 3, 4, and 5, and receive and output infrared control signals which are generated by the devices 120 and 130.

The home server 110 includes identification (ID) numbers of the modules 1, 2, 3, 4, and 5 and the path information necessary for allowing the command data to reach each of the modules 1, 2, 3, 4, and 5. The home server 110 also outputs the command data or receives the infrared control signals.

Figure 2:
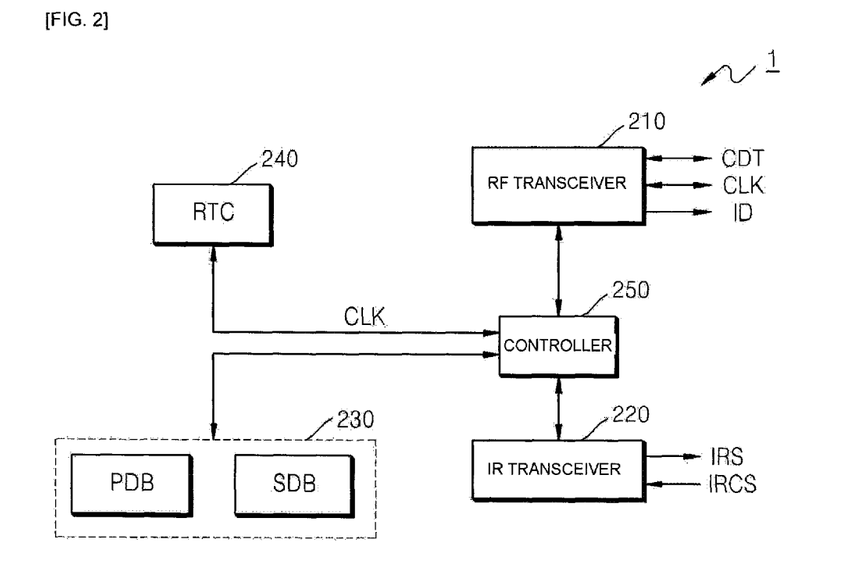
FIG. 2 is a block diagram of a module as shown in FIG. 1, according to an embodiment of the present invention.

FIG. 2 is a block diagram of a module as shown in FIG. 1, according to an embodiment of the present invention.

Since the plurality of modules 1, 2, 3, 4, and 5 have the same structures, the module 1 will be exemplarily described with reference to FIG. 2.

Referring to FIG. 2, the module 1 includes a radio frequency (RF) transceiver 210, an infrared (IR) transceiver 220, a controller 250, a memory unit 230, and a real time clock (RTC) 240.

The RF transceiver 210 receives or forwards command data CDT. Since the RF transceiver 210 receives or forwards an RF, the RF transceiver 210 performs authentications among modules and forwards the command data CDT to modules which are distant from the module 1. The command data CDT includes scope setting command data, scope response command data, path setting command data, and path search command data which will be described later.

The IR transceiver 220 outputs an infrared signal IRS to the devices 120 and 130 or receives infrared control signals IRCS from the devices 120 and 130. The infrared control signals IRCS include information regarding a state of the module 1. In other words, the IR transceiver 220 outputs the infrared signal IRS to the devices 120 and 130 and receives the infrared control signals IRCS from the devices 120 and 130 to inform the home server 110 of states of the devices 120 and 130 which operate in response to the infrared signal IRS.

The memory unit 230 stores a scope database (SDB) and a path setting database (PDB). Here, the SDB includes ID numbers of modules which are positioned within a range in which the output command data CDT is to be forwarded. The PDB includes ID numbers of modules through which the command data CDT passes until being forwarded from the home server 110 to the module 1.

The RTC 240 stores a current time and outputs time information CLK.

The controller 250 controls the RF transceiver 210 and the IR transceiver 220 in response to the SDB and the PDB and performs authentications using the time information CLK.

The modules 1, 2, 3, 4, and 5 must store the SDB and the PDB in order to allow the home server 110 to control the devices 120 and 130.

A process of obtaining a SDB through a module will now be described

Figure 3:
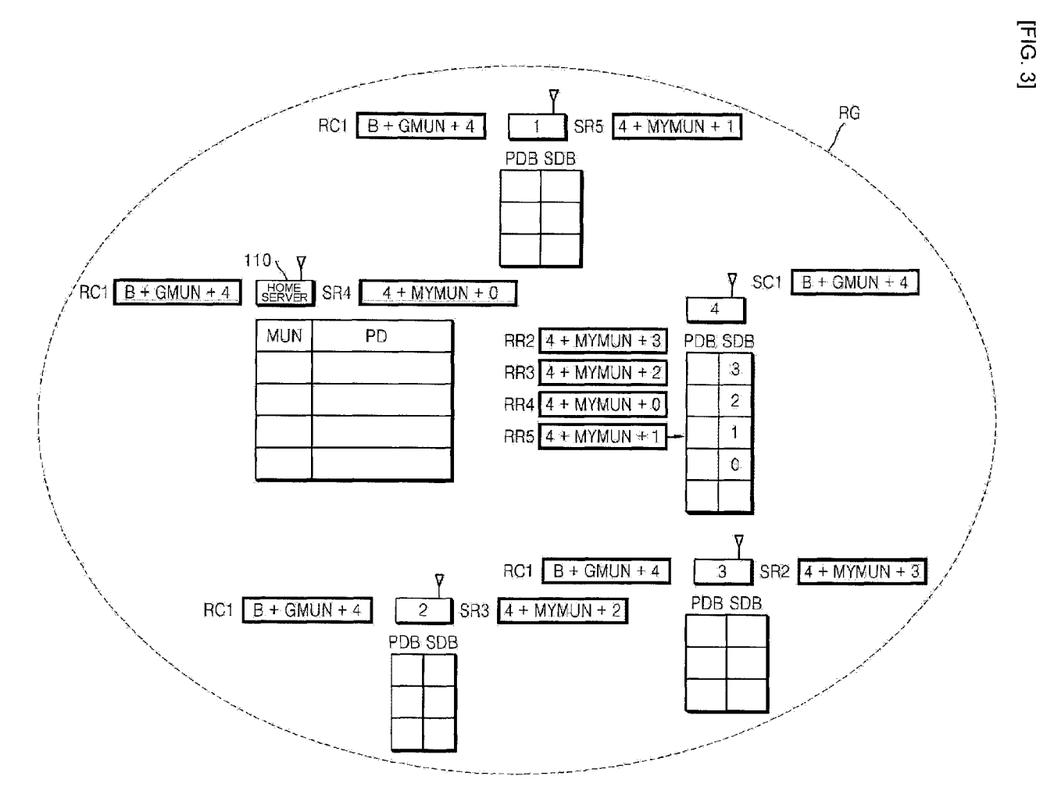
FIG. 3 illustrates a process of obtaining scope database (SDB) through a module according to an embodiment of the present invention.

FIG. 3 illustrates a process of obtaining a SDB through a module, according to an embodiment of the present invention.

For convenience, it is assumed that first, second, third, and fourth modules 1, 2, 3, and 4 are positioned around the home server 110. In other words, the first, second, third, and fourth modules 1, 2, 3, and 4 are installed at external infrared receivers of four devices (not shown).

For example, a process of obtaining a SDB through the forth module 4 will now be described. The fourth module 4 is reset. In other words, the fourth module 4 is reset and then outputs scope setting command data for creating a SDB.

The fourth module 4 outputs scope setting command data SC1 to set the SDB. Here, the scope setting command data SC1 has a structure of "a passing module number, a control code, and an ID number of the fourth module 4."

Here, the passing module number is broadcasting B indicating that the scope setting command data SC1 is forwarded to all neighboring modules that the scope setting command data SC1 is to reach, and the control code is a scope setting code GMUN indicating that the SDB is collected. In other words, the scope setting command data SC1 generated by the fourth module 4 has a structure of "B+GMUN+4."

The fourth module 4 outputs the scope setting command data SC1 to all of modules which are positioned within a range RG in which the scope setting command data SC1 is to reach. Since the home server 110 and the first, second, and third modules 1, 2, and 3 are positioned within the range RG in FIG. 1, the home server 110 and the first, second, and third modules 1, 2, and 3 receive the scope setting command data SC1 which is generated by the fourth module 4.

The scope setting command data SC1 that the home server 110 and the first, second, and third modules 1, 2, and 3 receive is represented as RC1.

The first, second, and third modules 1, 2, and 3 and the home server 110 respond to the scope setting command data SC1 to respectively forward scope response command data SR5, SR3, SR2, and SR4 to the fourth module 4 which has received the scope setting command data SC1. Each of the scope response command data SR2, SR3, SR4, and SR5 has a structure of "a target module number, a control code, and a corresponding module ID number."

The target module number is an ID number of a module which generates scope setting command data and which is known through an analysis of the received scope setting command data RC1. The control code is a scope response code MYMUN indicating that the corresponding module ID number is stored in the module which has generated the scope setting command data.

Therefore, the scope response command data SR5 generated by the first module 1 is "4+MYMUN+1," and the scope response command data SR4 generated by the home server 110 is "4+MYMUN+0." Operations of the fourth module 4 for receiving the scope response command data SR2, SR3, SR4, and SR5 are represented with reference characters RR2, RR3, RR4, and RR5, respectively.

The fourth module 4 analyzes the operations RR2, RR3, RR4, and RR5 to store ID numbers of the first, second, and third modules 1, 2, and 3 and the home server 110 positioned within the range RG as the SDB.

A process of obtaining a PDB through a module will now be described.

Figure 4:
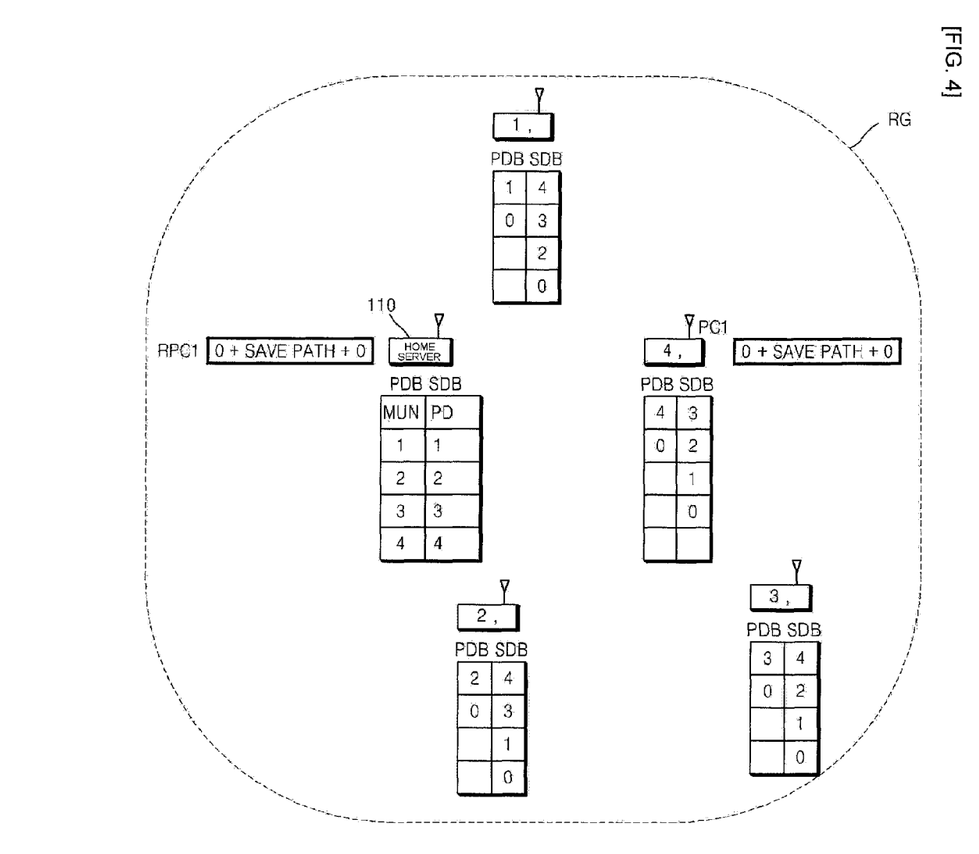
FIG. 4 illustrates a process of obtaining path setting database (PDB) through a module according to an embodiment of the present invention.

FIG. 4 illustrates a process of obtaining a PDB through a module, according to an embodiment of the present invention.

For convenience, it is assumed that first, second, third, and fourth modules 1, 2, 3, and 4 and a home server 110 are disposed as shown in FIG. 3. For example, a process of obtaining a PDB through the fourth module 4 will now be described.

The fourth module 4 outputs path setting command data PC1 to set a PDB with reference to a SDB. Here, the path setting command data PC1 has a structure of "a passing module number, a control code, a target module ID number, and path information."

If the SDB of the fourth module 4 includes ID number "0" of the home server 110, the passing module number is the ID number "0" of the home server 110. The fact that the SDB includes the ID number "0" of the home server 110 means that the home server 110 is positioned within a range RG in which the path setting command data PC1 is to reach. Thus, the fourth module 4 designates the home server 110 as a passing module number to which the path setting command data PC1 is to be forwarded.

A case where the SDB does not include the ID number "0" of the home server 110 will be described later.

The target module ID number is an ID number of a module that the path setting command data PC1 is to reach, i.e., an ID number of the home server 110. Thus, if the SDB includes the ID number "0" of the home server 110, the passing module number and the target module number are the same.

The path information is ID number "4" of the fourth module 4 which outputs the path setting command data PC1, and the control code is a path setting code SAVE PATH which commands the home server 110 to store an ID number corresponding to the path information. This is because the ID number of the fourth module 4 positioned within the range RG must be stored in the home server 110.

If the SDB includes the ID number "0" of the home server 110, the fourth module 4 may directly communicate with the home server 110. Thus, the fourth module 4 generates the path setting command data PC1 and stores its own ID number "4" and the ID number "0" of the home server 110 as the PDB.

The path setting command data PC1 generated by the fourth module 4 is forwarded only to the home server 110. Also, the path setting command data PC1 that the home server 110 receives is represented as RPC1. The first, second, and third modules 1, 2, and 3 also forward path setting command data to the home server 110 using the same method by which the fourth module 4 has forwarded the path setting command data PC1 to the home server 110.

There will now be described a process of obtaining a PDB when a communication with the home server 110 is performed through another module because the SDB does not include the ID number of the home server 110, i.e., the home server 110 is not positioned within the range RG.

Figure 5:
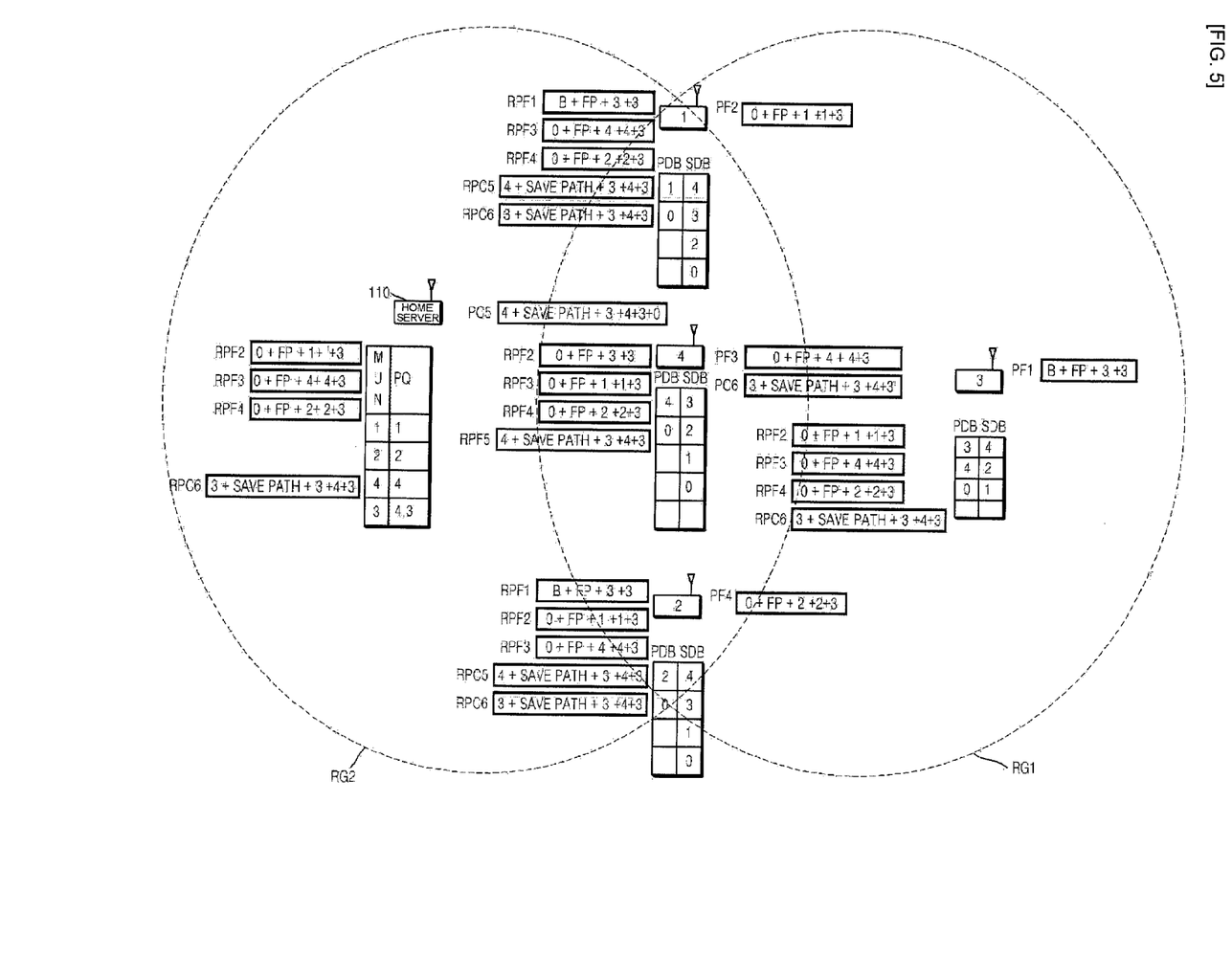
FIG. 5 illustrates a process of obtaining path setting database (PDB) through a module when a module is not able to directly communicate with a home server, according to an embodiment of the present invention.

FIG. 5 illustrates a process of obtaining a PDB when a direct communication with a home server is impossible, according to an embodiment of the present invention. Referring to FIG. 5, first, second, third, and fourth modules 1, 2, 3, and 4 and a home server 110 are disposed. The first, second, and fourth modules 1, 2, and 4 are positioned within a range RG1, in which a signal is to reach, based on the third module 3. The first, fourth, and second modules 1, 4, and 2 are positioned within a range RG2, in which a signal is to reach, based on the home server 110. In other words, the home server 110 and the third module 3 are not positioned within a range in which they directly exchange a signal with each other.

In this case, the third module 3 outputs path finding command data PF1 to set a PDB with reference to a SDB. Here, the path finding command data PF1 has a structure of "a passing module number, a control code, a corresponding module ID number, and path information.

The passing module number is broadcasting B indicating that the path finding command data PF1 is to be forwarded to the neighboring first, fourth, and second modules 1, 4, and 2 that the path finding command data PF1 is to reach if the SDB does not include an ID number of the home server 110. If the SDB includes the ID number of the home server 110, the passing module number is ID number "0" of the home server 110.

The control code is a code FIND PATH:FP which is to find a path which reaches from the third module 3, which outputs the path search command data PF1, to the home server 110. The path information is ID number "3" of a module which outputs the path finding command data PF1.

Therefore, the path finding command data PF1 output from the third module 3 has a structure of "B+FP+3+3."

If not a module generating path finding command data but an intermediate module receiving the path finding command data outputs new path finding command data, path information of the new path finding command data includes path information of received path finding command data and an ID number of the intermediate module.

If the first, second, and fourth modules 1, 2, and 4 receive the path finding command data PF1 generated by the third module 3, the path finding command data PF1 is represented as RPF1.

The first module 1 generates path finding command data PF2 in response to the path finding command data RPF1. Here, since a SDB of the first module 1 includes the ID number of the home server 110, the passing module number is ID number "0" of the home server 110. Since the first module 1 is an intermediate module, path information includes path information "3" of the path finding command data RPF1 and ID number "1" of the intermediate module. Therefore, the path finding command data PF2 output from the first module 1 is "0+FP+1+1+3."

The fourth module 4 generates path finding command data PF3 in response to the path finding command data RPF1. Here, since a SDB of the fourth module 4 includes the ID number of the home server 110, a passing module number is the ID number "0" of the home server 110. Also, since the fourth module 4 is an intermediate module, path information includes the path information "3" of the path finding command data RPF1 and ID number "4" of the intermediate module. Therefore, the path finding command data PF2 output from the first module 1 is "0+FP+4+4+3."

The second module 2 generates path finding command data PF4 in response to the path finding command data RPF1. Here, since a SDB of the second module 2 includes the ID number of the home server 110, a passing module number is the ID number "0" of the home server 110. Also, since the second module 2 is an intermediate module, path information includes the path information "3" of the path finding command data RPF1 and ID number "2" of the intermediate module. Therefore, the path finding command data PF4 output from the second module 2 is "0+FP+2+2+3."

The path finding command data PF2, PF3, and PF4 that the home server 110 receives are represented as RPF2, RPF3, and RPF4, respectively. The home server 110 responds only to one of the path finding command data RPF2, RPF3, and RPF4 output from one of the first, second, third, and fourth modules which is most adjacent to the home server 110. If the most adjacent module is the fourth module 4, the homer server 110 outputs path setting command data PC5 in response to the path finding command data RPF4.

The path setting command data PC5 has a structure of "a passing module number, a control code, a target module ID number, and path information.

The passing module number is ID number "4" of a module which outputs the path finding command data RPF4. The target module ID number is ID number of a module that the path setting command data PC5 is to reach and that is determined by path information of the path finding command data RPF4. "4+3" is represented in the path information of the path finding command data RPF4 and indicates that the third module 3 is a final target module that the path setting command data PC5 is to reach. Thus, the target module ID number is "3."

The path information is the same as the path information of the path finding command data RPF3, and the control code is a path setting code SAVE PATH which is to store the ID number "4+3" corresponding to the path information in the third module 3 corresponding to the target module ID number.

The path setting command data PC5 is forwarded to the third module 3 through the fourth module 4. The path setting command data PC5 that the fourth module 4 receives is represented as RPC5. The fourth module 4 outputs path setting command data PC6 in response to the path setting command data RPC5.

If the SDB of the fourth module 4 includes the target module ID number of the path setting command data RPC5, the target module ID number is the passing module number. Thus, the passing module number is "3." Thus, the target module ID number and the path information are determined with reference to the path setting command data RPC5.

The third module 3 receives the path setting command data PC6. The path setting command data PC6 that the third module 3 receives is represented as RPC6. The third module 3 stores path information "4+3" of the path setting command data RPC6 as a PDB. This indicates that the third module 3 must pass through the fourth module 4 to forward a signal to the home server 110.

Each of modules includes a SDB and a PDB through the above-described processes. Therefore, each of the modules includes information regarding neighboring modules and information regarding a path for forwarding a signal to the home server 110.

Even if a module is distant from the home server 110 or blocked by an obstacle, and thus it is difficult for the module to directly control the home server 110, another intermediate module may receive control signals output from the home server 110 to control a final module.

As illustrated in FIG. 5, the path setting command data PC5 is forwarded to the first and second modules 1 and 2 positioned within the range RG2 and is represented as RPC5. Also, the path setting command data PC6 is forwarded to the first and second modules 1 and 2 and the home server 110 positioned within the range RG2 and is represented as RPC6. However, the first and second modules 1 and 2 and the home server 110 neglect the path setting command data RPC5 and RPC6. In other words, the first and second modules 1 and 2 and the home server 110 analyze the path setting command data RPC5 and RPC6 to determine whether the passing module numbers or the target module numbers include module ID numbers related to the first and second modules 1 and 2 and the home server 110. If the passing module numbers or the target module numbers do not include the module ID numbers related to the first and second modules 1 and 2 and the home server 110, the first and second modules 1 and 2 and the home server 110 neglect the path setting command data RPC5 and RPC6.

The path finding command data RPF3 or RPF4 forwarded to the first module 1, the path finding command data RPF2 or RPF4 forwarded to the fourth module 4, the path finding command data RPF2 or RPF3 forwarded to the second module 2, and the path finding command data RPF2, RPF3, or RPF4 forwarded to the third module 3 are neglected by corresponding modules.

Figure 6:
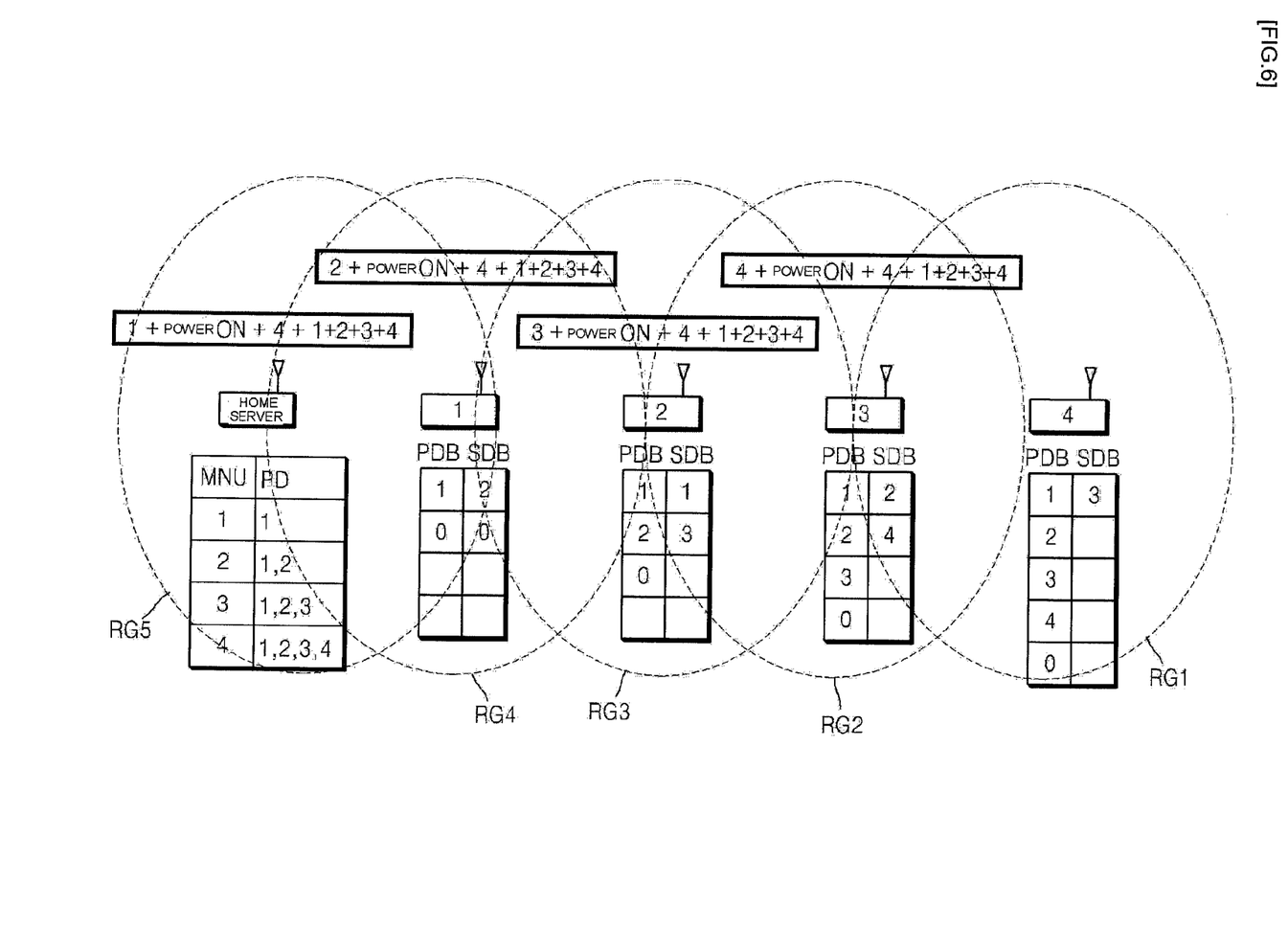
FIG. 6 illustrates an order of controlling modules through a home server, wherein the modules are distant from the home server, according to an embodiment of the present invention.

FIG. 6 illustrates an order of controlling modules through a home server, wherein the modules are distant from the home server, according to an embodiment of the present invention. Referring to FIG. 6, a home server 110 and first, second, third, and fourth modules 1, 2, 3, and 4 are disposed. Only the first module 1 is positioned within in a range RG5 in which a signal output from the home server 110 is to be forwarded. The home server 110 and the second module 2 are positioned within a range RG4 in which a signal output from the first module 1 is to be forwarded. The first and third modules 1 and 3 are positioned within a range RG3 in which a signal output from the second module 2 is to be forwarded. The second and fourth modules 2 and 4 are positioned within a range RG2 in which a signal output from the third module 3 is to be forwarded. The third module 3 is positioned within a range RG1 in which a signal output from the fourth module 4 is to be forwarded. A data transmission path for controlling the fourth module 4 through the home server 110 will now be described. Each of the first, second, third, and fourth modules 1, 2, 3, and 4 includes a SDB and a PDB through the above-described processes.

The home server 110 outputs command data "1+Power On+4+1+2+3+4." A passing module number is "1," a target module number is "4," a control code is "Power On" which is to power on a device in which the fourth module 4 is installed, and path information is "1+2+3+4."

In other words, the home server 110 forwards a command to power a device on to the fourth module 4 through the first, second, and third modules 1, 2, and 3. When he fourth module 4 receives the control code, the fourth module 4 forwards an infrared signal to a corresponding device to power the corresponding device on.

Devices distant from the home server 110 may be controlled by the home server 110 using the above-described method.

Figure 7:
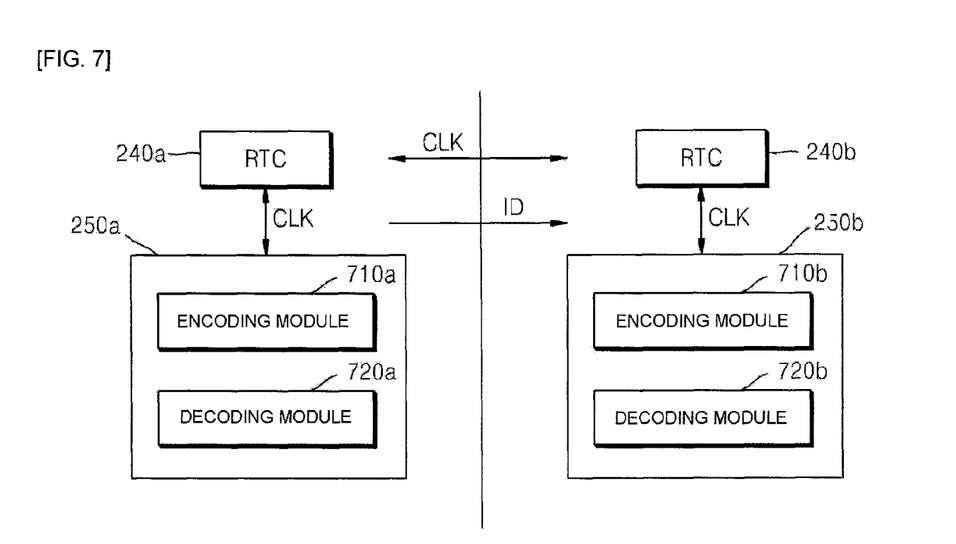
FIG. 7 illustrates a method of reciprocally authenticating modules, according to an embodiment of the present invention.

FIG. 7 illustrates a method of reciprocally authenticating modules, according to an embodiment of the present invention.

A RTC of each of modules forwards time information, and a controller of each of the modules includes an encoding module and a decoding module for authenticating the modules using the time information.

Referring to FIG. 7, a controller 250a of a module includes an encoding module 710a and a decoding module 720a. The controller 250a forwards encoded data ID, which includes time information CLK as a key value, to a corresponding module using the RF transceiver 210, wherein the time information CLK is obtained at encoding time.

A decoding module 720b of a controller 250b of the corresponding module decodes the encoded data ID in response to time information CLK. The encoded data ID includes an ID number of a module which receives the encoded data ID.

Therefore, the decoding module 720b decodes the encoded data ID only when the ID number included in the encoded data ID is an ID number of the corresponding module of the decoding module 720b. Since the controller 250b of the corresponding module also includes an encoding module 710b and the decoding module 720b, the controller 250b may perform the same operation as the controller 25a.

Also, RTCs 240a and 240b of the modules synchronize with each other so that the modules have synchronized time information CLK. In other words, the time information CLK, which is generated by the RTC240a of the module when the encoded data ID is generated, is transmitted to the RTC 240b of the corresponding module. Also, the RTCs 240a and 240b synchronize with each other. Thus, if the received time information CLK is analyzed as a key value, the received encoded data ID may be decoded.

In other words, each time the encoded data ID is generated, the time information CLK is changed. Thus, the time information CLK is used as a value for decoding to be forwarded to another module together with the encoded data ID.

The above-described authentication process is performed to prevent modules from being operated by command data generated in a place except the home server 110. The methods of performing encoding and decoding using time information CLK as the key value will be understood by those of ordinary skill in the art, and thus their detailed descriptions will be omitted.

If a device controlled by a module outputs a signal including information regarding an operation state of the device, an infrared control signal IRCS is the signal including the information regarding the operation state of the device. In other words, an air conditioner, a TV set, etc. controlled infrared rays include devices which are controlled infrared signals and then output their current operation states as infrared signals. Infrared control signals IRCS are signals including information regarding current operation states of devices as described above, wherein the signals are output from the devices.

For example, if the home server 110 outputs command data to power on a device including the fourth module 4, the fourth module 4 outputs the infrared signal IRS to power the device including the fourth module 4 on as described with reference to FIG. 6.

Here, the device, which is powered on, forwards an infrared control signal IRCS to the fourth module 4. A controller of the fourth module 4 analyzes the received infrared control signal IRCS to recognize that the device has been powered on, and then forwards information regarding this state to the home server 110 using an RF transceiver. Even in this case, if a module is distant from the home server 110 or an obstacle is placed in front of the module, information regarding this state is forwarded to the home server 110 through other modules like command data.

While the present invention has been particularly shown and described with reference to exemplary embodiments thereof, it will be understood by those of ordinary skill in the art that various changes in form and details may be made therein without departing from the spirit and scope of the present invention as defined by the following claims.

INDUSTRIAL APPLICABILITY

The present invention may be applied in the field of network system using an infrared signal.

The invention claimed is:

1. A network system for controlling devices which operate in response to an infrared signal, comprising:
  modules which output an infrared signals for controlling the devices in response to command data or analyze path information of the command data, forward the command data to next one of the modules, and receive infrared control signals generated by the devices; and
  a home server which comprises identification (ID) numbers of the modules and the path information of the command data for allowing the command data to reach each of the modules and outputs the command data or receives the infrared control signals,
  wherein each of the modules comprises:
  a radio frequency (RF) transceiver which receives or forwards the command data;
  an infrared (IR) transceiver which outputs the infrared signal to the devices or receives the infrared control signals from the devices;
  a memory unit which stores a scope database (SDB) and a path database (PDB), wherein the SDB indicates ID numbers of modules positioned within a range in which the command data is to be forwarded, and the PDB indicates ID numbers of modules through which the command data passes to be forwarded from the home server to a final one of the modules;
  a real time clock (RTC) which stores current time and outputs time information; and
  a controller which controls the RF transceiver and the IR transceiver in response to the SDB and the PDB and performs authentications using the time information of the RTC.

2. The network system of claim 1, wherein each of the modules outputs scope setting command data to set the SDB,
  wherein the scope setting command data has a structure of "a passing module number, a control code, and a corresponding module ID number,"
  wherein the passing module number is broadcasting B indicating that the command data is forwarded to all of neighboring modules that the scope setting command data is to reach, and the control code is a scope setting code GMUN indicating that the SDB is collected.

3. The network system of claim 1, wherein each of the modules and the home server forward scope response command data to one of the modules, which has forwarded the scope setting command data, in response to the scope setting command data,
  wherein the scope response command data has a structure of "a target module number, a control code, and a corresponding module ID number,"
  wherein the target module number is an ID number of one of the modules which has generated the scope setting command data, and the control code is a scope response code MYMUN which is to store the corresponding module ID number in the module which has generated the scope setting command data.

4. The network system of claim 3, wherein the module is reset and then outputs the scope setting command data for collecting the SDB.

5. The network system of claim 1, wherein each of the modules outputs path setting command data to set the PDB with reference to the SDB,
  wherein the path setting command data has a structure of "a passing module number, a control code, a target module ID number, and path information,"
  wherein if the SDB comprises an ID number of the home server, the passing module number is the ID number of the home server, the target module ID number is an ID number of a module that the path setting command data is to reach, i.e., the ID number of the home server, the path information is an ID number of a module which outputs the path setting command data, and the control code is a path setting code SAVE PATH which is to store an ID number corresponding to the path information in the home server.

6. The network system of claim 5, wherein if the SDB comprises the ID number of the home server, each of the modules generates the path setting command data and stores its own ID number and the ID number of the home server as the PDB.

7. The network system of claim 5, wherein one of the modules or the home server outputs the path setting command data in response to predetermined path finding command data,
  wherein the path setting command data has a structure of "a passing module number, a control code, a target module ID number, and path information,"
  wherein the passing module number is an ID number of one of the modules which outputs the path finding command data, the target module ID number is an ID number of one of the modules that the path setting command data is to reach and is determined by path information of the path finding command data, the path information is the same as the path information of the path finding command data, and the control code is a path setting code SAVE PATH which is to store an ID number corresponding to the path information in one of the modules corresponding to the target module ID number.

8. The network system of claim 7, wherein the path finding command data is command data which is output from the module to set the PDB with reference to the SDB and has a structure of "a passing module number, a control code, a corresponding module ID number, and path information,"
  wherein the passing module number is broadcasting B indicating that the command data is forwarded to all of neighboring modules that the path finding command data is to reach if the SDB does not comprise the ID number of the home server, but the passing module number is the ID number of the home server if the SDB comprises the ID number of the home server, the control code is a code FIND PATH:FP which is to find a path reaching from one of the modules outputting the path finding command data to the home server, and the path information comprises an ID number of one of the modules which outputs the path finding command data and an ID number comprising path information of received path finding command data if an intermediate one of the modules receives the path finding command data and then outputs new path finding command data.

9. The network system of claim 1, wherein real time clocks (RTCs) of the modules synchronize with one another so that the modules comprise synchronized time information.

10. The network system of claim 9, wherein the controller comprises an encoding module and a decoding module, wherein the encoding module forwards encoded data, which comprises time information as a key value, to a corresponding module, wherein the time information is obtained at encoding time, and a decoding module of a controller of the corresponding module decodes the encoded data in response to the time information to authenticate the module, wherein the encoded data comprises an ID number of one of the modules which receives the encoded data.

11. The network system of claim 1, wherein if the devices controlled by the modules output signals comprising information regarding their operation states, the infrared control signals are the signals comprising the information regarding the operation states.

* * * * *